United States Patent
Chan et al.

(10) Patent No.: US 6,903,013 B2
(45) Date of Patent: Jun. 7, 2005

(54) METHOD TO FILL A TRENCH AND TUNNEL BY USING ALD SEED LAYER AND ELECTROLESS PLATING

(75) Inventors: Lap Chan, Singapore (SG); Sanford Chu, Singapore (SG); Chit Hwei Ng, Singapore (SG); Yong Ju, San Jose, CA (US); Jia Zhen Zheng, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 10/439,923

(22) Filed: May 16, 2003

(65) Prior Publication Data

US 2004/0229457 A1 Nov. 18, 2004

(51) Int. Cl.[7] .................................. H01L 21/44
(52) U.S. Cl. ........................ 438/678; 118/719
(58) Field of Search .................. 438/678; 118/719; 257/E21.175, E21.584, E21.585

(56) References Cited

U.S. PATENT DOCUMENTS

| | | | |
|---|---|---|---|
| 5,124,192 A * | 6/1992 | Kim et al. ................ | 428/215 |
| 6,008,102 A | 12/1999 | Alford et al. ............ | 438/381 |
| 6,042,652 A | 3/2000 | Hyun et al. .............. | 118/719 |
| 6,146,458 A | 11/2000 | Hooper et al. ........... | 117/106 |
| 6,225,221 B1 | 5/2001 | Ho et al. .................. | 438/678 |
| 6,305,314 B1 | 10/2001 | Sneh et al. ............... | 118/723 R |
| 6,316,359 B1 * | 11/2001 | Simpson .................. | 438/678 |
| 6,329,234 B1 | 12/2001 | Ma et al. .................. | 438/210 |
| 6,368,954 B1 * | 4/2002 | Lopatin et al. .......... | 438/627 |
| 6,423,201 B1 * | 7/2002 | Mandrekar ............... | 205/186 |
| 6,596,643 B2 * | 7/2003 | Chen et al. ............... | 438/706 |
| 2003/0008243 A1 * | 1/2003 | Ahn et al. ................ | 430/314 |

OTHER PUBLICATIONS

CS–01–127, U.S. Appl. No. 10/400,511, filed Mar. 27, 2003, assigned to a common assignee, "A Method of Forming a Surface Coating Layer Within an Opening Within a Body by Atomic Layer Desposition".

* cited by examiner

*Primary Examiner*—George Fourson
*Assistant Examiner*—Fernando L. Toledo
(74) *Attorney, Agent, or Firm*—George O. Saile; Rosemary L. S. Pike

(57) ABSTRACT

An improved method to deposit, by atomic layer deposition, ALD, a copper barrier and seed layer for electroless copper plating, filling trench and channel or tunnel openings in a damascene process, for the fabrication of interconnects and inductors, has been developed. A process flow outlining the method of the present invention is as follows: (1) formation of trenches and channels, (2) atomic layer deposition of copper barrier and seed, (3) electroless deposition of copper, (4) chemical mechanical polishing back of excess copper, and (5) barrier deposition, SiN, forming copper interconnects and inductors.

54 Claims, 3 Drawing Sheets

METHOD TO FILL A TRENCH AND TUNNEL BY USING ALD SEED LAYER AND ELECTROLESS PLATING

RELATED PATENT APPLICATIONS

This application is related to filing date Mar. 27, 2003, Ser. No. 10/400,511, assigned to a common assignee, now issued as U.S. Pat. No. 6,716,693.

BACKGROUND OF THE INVENTION (1) Field of the Invention

This invention relates to a method to deposit by atomic layer deposition, ALD, a copper barrier and seed layer for electroless copper plating, filling trench and channel or tunnel openings in a damascene process, for the fabrication of interconnects and inductors.

(2) Description of Related Art

In this section a description of related Prior Art background patents follows.

U.S. Pat. No. 6,225,221 B1 entitled "Method to Deposit a Copper Seed Layer for Dual Damascene Interconnects" granted May 1, 2001 to Ho et al. describes a method of depositing a copper seed layer in the manufacture of an integrated circuit device. The copper seed layer is thin and conformal for subsequent electroless plating of copper. A dielectric layer is patterned to form vias and trenches for planned dual damascene interconnects. A barrier layer of tantalum, titanium, or tungsten is deposited overlying the dielectric layer to line the vias and trenches. A copper seed layer is deposited overlying the barrier layer by the reaction of $CuF_2$ vapor with the barrier layer.

U.S. Pat. No. 6,305,314 B1 entitled "Apparatus and Concept for Minimizing Parasitic Chemical Vapor Deposition During Atomic Layer Deposition" granted Oct. 23, 2001 to Sneh et al. teaches a method and apparatus for avoiding contamination of films deposited in layered depositions, such as Atomic Layer Deposition (ALD) and other sequential chemical vapor deposition (CVD) processes. The CVD deposited contamination of ALD films is prevented by use of a pre-reaction chamber that effectively causes otherwise-contaminating gaseous constituents to deposit on wall elements of gas-delivery apparatus prior to entering the ALD chamber.

U.S. Pat. No. 6,008,102 entitled "Method of Forming a Three-Dimensional Integrated Inductor" granted Dec. 28, 1999 to Alford et al. describes a method of fabricating a three-dimensional inductor coil is fabricated. The fabrication process includes the steps of: depositing a first photoresist layer, forming a trench therein, and filling the trench with electroplated metal. A second photoresist layer is deposited, and first and second trenches are formed therein and filled with electroplated metal. A third photoresist layer is deposited and a trench formed therein, and then filled with electroplated metal. The first, second, and third photoresist layers are then removed to expose a multi-loop inductor coil.

U.S. Pat. No. 6,329,234 B1 entitled "Copper Process Compatible CMOS Metal-Insulator-Metal Capacitor Structure and Its Process Flow" granted Dec. 11, 2001 to Ma et al. teaches that in many mixed-signal or radio frequency Rf applications, inductors and capacitors are needed at the same time. For a high performance inductor devices, a thick metal layer is needed to increase performance, usually requiring an extra masking process. The invention describes both a structure and method of fabricating both copper metal-insulator-metal (MIM) capacitors and thick metal inductors, simultaneously, with only one mask, for high frequency mixed-signal or Rf, CMOS applications, in a damascene and dual damascene trench/via process.

U.S. Pat. No. 6,146,458 entitled "Molecular Beam Epitaxy Method" granted Nov. 14, 2000 to Hooper et al. describes a method of growing a layer of Group III nitride material on a substrate by molecular beam epitaxy that includes the steps of: (i) disposing a substrate in a vacuum chamber, (ii) reducing the pressure in the vacuum chamber to a pressure suitable for epitaxial growth by molecular beam epitaxy, (iii) supplying ammonia through an outlet of a first supply conduit into the vacuum chamber so that the ammonia flows towards the substrate; and (iv) supplying a Group III element in elemental form through an outlet of a second supply conduit into the vacuum chamber so that said Group III element flows towards the substrate. The method causes a layer containing Group III nitride to be grown on the substrate by molecular beam epitaxy.

U.S. Pat. No. 6,042,652 entitled "Atomic Layer Deposition Apparatus for Depositing Atomic Layer on Multiple Substrates" granted Mar. 28, 2000 to Hyun et al. describes an atomic layer deposition (ALD) apparatus capable of depositing a thin film on a plurality of substrates. The atomic layer deposition apparatus includes: a vacuum chamber, a reactor installed in the vacuum chamber, having a plurality of modules which can he assembled and disassembled as desired. A plurality of stages as spaces are partitioned by assembling the plurality of modules. Openings allow each stage to receive one substrate. Also, there is a plurality of gas supply lines installed in the modules, for injecting gases from a gas supply portion into the stages.

SUMMARY OF THE INVENTION

It is a general object of the present invention to provide an improved method to deposit, by atomic layer deposition, ALD, a copper barrier and seed layer for electroless copper plating, filling trench and channel or tunnel openings in a damascene process, for the fabrication of interconnects and inductors.

A process flow outlining the method of the present invention is as follows:

(1) Formation of trenches and channels,
(2) Atomic layer deposition of copper barrier and seed,
(3) Electroless deposition of copper,
(4) Chemical mechanical polishing back of excess copper,
(5) Barrier deposition, SiN, forming copper interconnects and inductors.

Key to the method of the present invention, is the deposition by atomic layer deposition of the copper barrier and seed layer for subsequent electroless copper plating of damascene trench and channel or tunnel openings. The end result is the fabrication of inlaid copper interconnects and inductors.

The following processing steps summarize the basic method of the present invention. Firstly, providing a first insulating layer, which overlies a semiconductor substrate with a passivating, etch stop layer thereon. Also, providing a second insulating layer which overlies the first insulating layer. Next, forming trench and channel or tunnel openings in the insulating layers. Next, is the key step of depositing a first copper barrier layer which overlies the insulating layers, by atomic layer deposition. Next, the second key step is of depositing a copper seed layer which overlies the first copper barrier layer, by atomic layer deposition. Next, electroless copper is plated on the copper seed layer filling trench and channel or tunnel openings with an excess of copper. Finally, the excess of copper is removed and planarizing back the excess copper by chemical mechanical polishing. A deposition of a second copper barrier layer is performed which overlies the copper, and thus, the fabrication of inlaid copper interconnects and inductors is complete.

This invention has been summarized above and described with reference to the preferred embodiments. Some processing details have been omitted and are understood by those skilled in the art. More details of this invention are stated in the "DESCRIPTION OF THE PREFERRED EMBODIMENTS" section.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

It is a general object of the present invention to provide an improved method to deposit, by atomic layer deposition, ALD, a copper barrier and seed layer for electroless copper plating, filling trench and channel or tunnel openings in a damascene process, for the fabrication of interconnects and inductors.

The process flow outlining the method of the present invention is as follows: (1) formation of trenches and channels, (2) atomic layer deposition of copper barrier and seed, (3) electroless deposition of copper, (4) chemical mechanical polishing back of excess copper, and (5) barrier deposition, SiN, forming both copper interconnects and inductors.

The following processing steps outline the method: Firstly, providing a first insulating layer, which overlies a semiconductor substrate with a passivating, etch stop layer thereon. Also, providing a second insulating layer overlies the first insulating layer. Next, forming trench and channel or tunnel openings in the first and second insulating layers. Next, is the key step of depositing a first copper barrier layer which overlies the insulating layers, by atomic layer deposition. Next, the second key step is of depositing a copper seed layer which overlies the first copper barrier layer, by atomic layer deposition. Next, electroless copper is plated on the copper seed layer filling trench and channel or tunnel openings with an excess of copper. Finally, the excess of copper is removed and planarizing back the excess copper by chemical mechanical polishing. A deposition of a second copper barrier layer is performed which overlies the copper, and thus, the fabrication of inlaid copper interconnects and inductors is complete.

Figure 1:
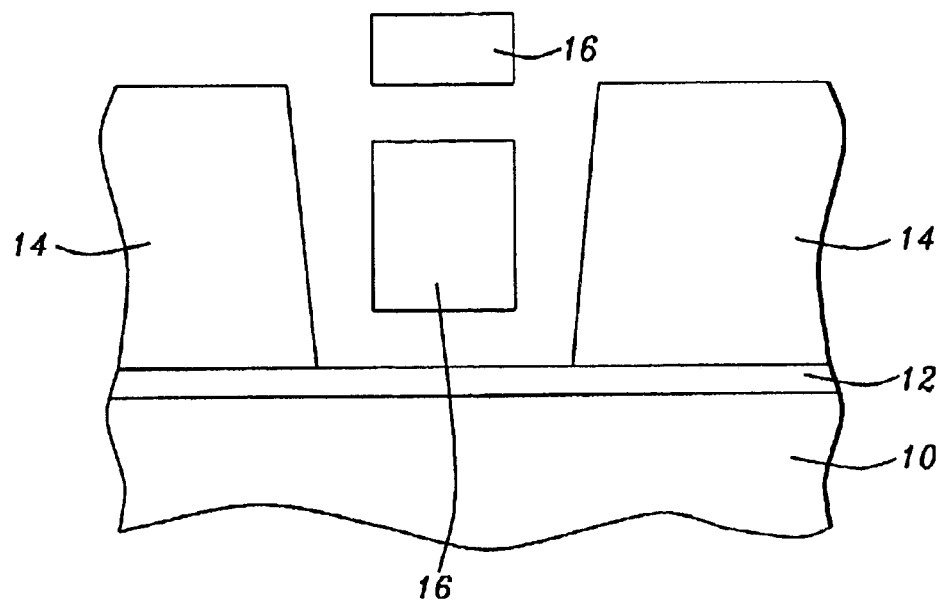
FIG. 1, which in cross-sectional representation illustrates the first part of the method of the present invention, the formation of trenches and channels.

Referring to FIG. 1, which in cross-sectional representation illustrates the first part of the method of the present invention, the formation of trenches and channels. The substrate is a silicon substrate 10, over the substrate 10 is formed a thin passivating, etch stop layer 12. Next, a first insulating layer 14 is formed, and finally a second insulating layer 16 is formed.

Again, referring to FIG. 1, provided is a semiconductor substrate 10, with a thin passivating, etch stop layer 12 thereon. The semiconductor substrate 10 includes one or more layers of insulating material and/or conductive material and one or more active and/or passive devices, formed in or over the substrate, or module, and one or more interconnect structures, such as, vias, contacts, trenches, metal wiring and the like. The first (14) and second (16) insulating layers are comprised of low dielectric constant material or materials comprising: SiN, SiO, SOG spin-on glass, PE plasma enhanced TEOS, tetraethoxysilane deposition, halogenated SiO, fluorinated silicate glass in a thickness range from 2,000 to 10,000 Angstroms, deposited by CVD chemical vapor deposition or SOG, spin-on glass. As sketched in FIG. 1, formed in the first 14 and second 16 insulating layers are trench and channel or tunnel opening depicted by the absence of insulating material.

Figure 2:
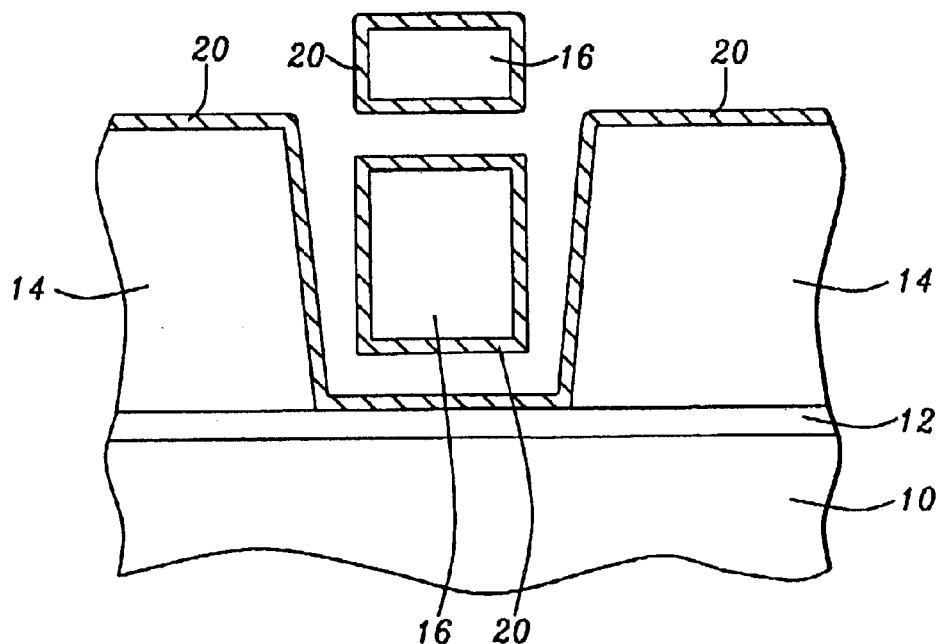
FIG. 2, which in cross-sectional representation illustrates the second part of method of the present invention, the atomic layer deposition of the copper barrier and copper seed layer.

Referring to FIG. 2, which in cross-sectional representation illustrates the second part of method of the present invention, the atomic layer deposition of a first copper barrier and copper seed layer, over the insulating layers 14 and 16. These thin layers are difficult to sketch, therefore the combination of barrier and seed layer is referred to as 20, in FIG. 2. The barrier layer thickness is between 20 to 200 Angstroms, and the copper seed layer comprised of copper is also between 20 to 200 Angstroms and is deposited over the barrier layer. A list of barrier materials is found in TABLE 1. Deposition temperature for TaN, for example, is approximately between 200 to 500° C. The copper barrier layer overlying the insulating layers, is comprised of TiN, TiSiN, TaN, TaN$_x$, (Mo$_2$N and MoN), NbN, or WN$_x$, deposited by atomic layer deposition, as outlined in TABLE 1.

The atomic layer deposition method developed for the copper barrier and copper seed layers above, is a discontinuous thin film growth method, whereby exactly one monolayer of desired material is formed per atomic layer deposition cycle. This is accomplished by self-limiting surface reactions of precursor compounds "A" and "B", which form the desired product "S" in a binary cycle comprising two sequential half-reactions, as outlined in TABLE 1. Note, both half-reactions are complete and self-limiting at the monolayer level, and therefore, the total film thickness deposited by the atomic layer deposition is controlled by the number of applied deposition cycles. The copper barrier layer overlying the insulating layers, is comprised of precursors compound A plus compound B to yield compound S, deposited by atomic layer deposition, thickness range from 20 to 200 Angstroms, with atomic layer deposition conditions of: approximate substrate temperature ranges from 150 to 550° C., as outlined in TABLE 1, pressure ranges from 10 to 200 mTorr, deposition rate ranging from 0.01 to 0.6 nm per cycle, and pulse time varying from 0.05 to 0.5 seconds.

Some of the detailed specifications listed in TABLE 1 are the following chemical compounds and formulae: TEMAT is Ti[N(C$_2$H$_5$)$_2$]$_4$, tetrakis-(ethylmethylamido)titanium; TDMAT is Ti[N(CH$_3$)$_2$]$_4$, tetrakis-(dimethyl(amino)

titanium; TBTDET is $N(Et_2)_3Ta=NBu^+$, tert-butylimido tris-(diethylamido) tantalum.

TABLE 1

| SUBSTRATE T (° C.) | PRECURSORS: A | B | S |
|---|---|---|---|
| ~400 to 500 | $TiCl_4$ | $NH_3$ | TiN |
| ~350 to 500 | $TiI_4$ | $NH_3$ | TiN |
| ~300 to 400 | $(TiCl_3 + Ti_2Cl_2)$ | $+ NH_3$ | TiN |
| ~150 to 400 | TEMAT | $NH_3$ | TiN |
| ~150 to 250 | TDMAT | $SiH_4$ | TiSiN |
| 200 to 500 | $TaCl_5$ | $NH_3$ | $TaN_x$ |
| 200 to 300 | TBTDET | $H^+$ radicals | TaN |
| ~500 | $MoCl_5$ | $NH_3$ | $Mo_2N$ and MoN |
| ~500 | $NbCl_5$ | $NH_3$ | NbN |
| 300 to 550 | $WF_6$ | $NH_3$ | $WN_x$ |

Detailed specification for the copper seed layer overlying the copper barrier layer, comprising copper deposited by atomic layer deposition conditions: thickness range from 20 to 200 Angstroms, approximate temperature range from 200 to 300° C., pressure range from 10 to 200 mTorr, deposition rate ranging from 0.01 to 0.05 nm per cycle, and pulse time varying from 0.05 to 0.5 seconds. Furthermore, the copper seed layer deposition is comprises precursors of compound A, copper(II)-hexafluoroacetyacetonate or copper(thd)$_2$, tetramethyl heptanedione and water vapor, as a first step, then followed by compound B, reducing agent isopropanol or formalin, to yield S, the copper seed layer.

Figure 3:
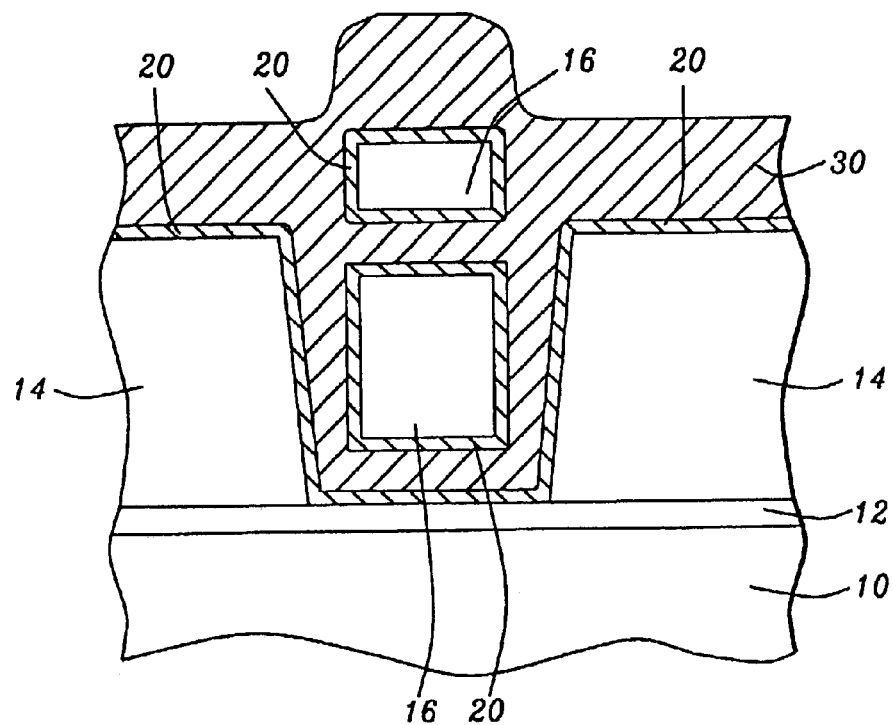
FIG. 3, which in cross-sectional representation illustrates the third part of method of the present invention, the electroless deposition of copper forming excess copper on the surface.

Referring to FIG. 3, which in cross-sectional representation illustrates the third part of method of the present invention, the electroless deposition of copper 30, over the barrier and seed layer 20, forming excess copper on the surface. The thick copper layer 30 dips into the trench, channel and tunnel openings. The plated thick copper deposition is approximately from 2,000 to 10,000 Angstroms in thickness. The electroless plated copper on the copper seed layer, filling trench and channel or tunnel openings with an excess of copper, comprising the following deposition conditions: a liquid plating bath mixture comprising $CuSO_4$, HF, HCl, $CH_2O$ with heating in a temperature range from 25 to 65° C.

Figure 4:
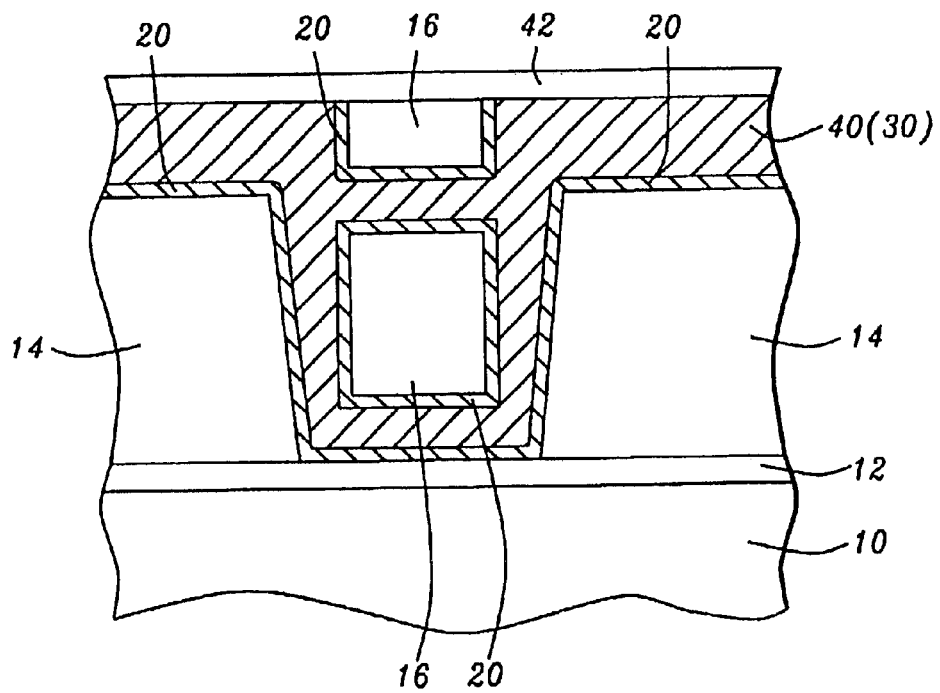
FIG. 4, which in cross-sectional representation illustrates the final part of the method of the present invention, in which the excess copper is removed from the surface and planarized by chemical mechanical polishing.

Referring to FIG. 4, which in cross-sectional representation illustrates the final part of the method of the present invention, in which the excess copper is removed from the surface and planarized by chemical mechanical polishing. Thus, is formed both inlaid copper interconnect wiring and copper inductors, 40 (30).

Referring yet again to FIG. 4, in cross-sectional representation, illustrates the planarization of the excess material in the trench, channel and tunnel openings channels to form conducting interconnect wiring, with inlaid copper in a damascene process. Note, the excess material in the thick copper layer is polished back and planarized, along with regions of the barrier and copper seed layer, by chemical mechanical polish (CMP). After this step, a second copper barrier layer 42 overlying the copper 40 (30), is deposited by PECVD, plasma-enhanced chemical vapor deposition, and is comprised of a layer of SiN, in a thickness ranging from 200 to 1000 Angstroms. This completes the process and the barrier layer is used as a bottom layer in forming subsequent copper interconnects and inductors. Therefore, the above processing steps can be repeated to produce multi-level metal wiring and inductor layers.

Figure 5:
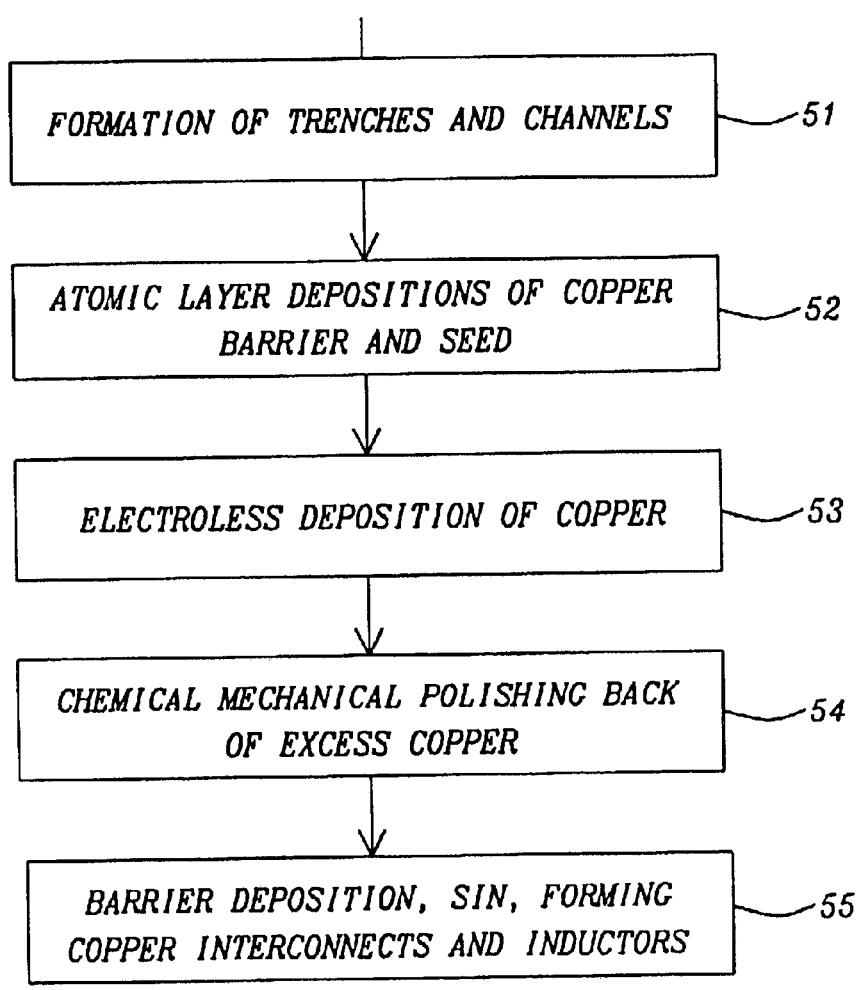
FIG. 5 is a process flow chart of outlining the method of the present invention.

In summation, referring to FIG. 5, the process flow chart outlining the method of the present invention is as follows:

(51) Formation of trenches and channels,
(52) Atomic layer deposition of copper barrier and seed,
(53) Electroless deposition of copper,
(54) Chemical mechanical polishing back of excess copper,
(55) Barrier deposition, SiN, forming copper interconnects and inductors.

While the invention has been particularly shown and described with reference to the preferred embodiments thereof, it will be understood by those skilled in the art that various changes in form and details may be made without departing from the spirit and scope of the invention.

What is claimed is:

1. A method to deposit a copper barrier and seed layer for electroless copper plating, filling trench and channel or tunnel openings in the fabrication of interconnects and inductors, comprising the following steps:
   (a) providing a first insulating layer, overlying a semiconductor substrate with a passivating, etch stop layer thereon;
   (b) providing a second insulating layer overlying said first insulating layer;
   (c) forming trench and channel or tunnel openings in the insulating layers;
   (d) depositing a first copper barrier layer overlying said insulating layers, by atomic layer deposition;
   (e) depositing a copper seed layer overlying said first copper barrier layer, by atomic layer deposition using precursors of copper compound A, copper(II)-hexafluoroacetyacetonate or copper(thd)$_2$, tetramethyl heptanedione and water vapor, as a first step, then followed by compound B, reducing agents isopropanol or formalin;
   (f) performing electroless copper plating copper on said copper seed layer filling trench and channel or tunnel openings with an excess of copper;
   (g) removing said excess of copper and planarizing back the excess copper by chemical mechanical polishing;
   (h) depositing a second copper barrier layer overlying the copper, thus completing the fabrication of inlaid copper interconnects and inductors.

2. The method of claim 1, wherein said substrate includes a semiconductor substrate or module, wherein the substrate with semiconductor device structures comprising gate electrodes and source/drain regions.

3. The method of claim 1, wherein said substrate includes a semiconductor substrate or module, wherein the substrate with semiconductor device structures comprising, gate electrodes, source/drain regions and multiple levels of metal interconnections.

4. The method of claim 1, wherein multilevel inlaid copper interconnects and inductors are fabricated by repeating steps (b) through (h).

5. The method of claim 1, wherein said first and second insulating layers are comprised of low dielectric constant material or materials comprising: SiN, SiO, SOG spin-on glass, PE plasma enhanced TEOS, tetraethoxysilane deposition, halogenated SiO, fluorinated silicate glass in a thickness range from 2,000 to 10,000 Angstroms, deposited by chemical vapor deposition or SOG, spin-on glass.

6. The method of claim 1, wherein said first copper barrier layer overlying the insulating layers, is comprised of TiN, TiSiN, TaN, $TaN_x$, ($Mo_2N$ and MoN), NbN, or $WN_x$, deposited by atomic layer deposition, to a thickness ranging from 20 to 200 Angstroms.

7. The method of claim 1, wherein said first copper barrier layer overlying the insulating layers comprising precursors of compound A plus compound B to yield compound S, deposited by atomic layer deposition, comprising a thickness range from 20 to 200 Angstroms, with atomic layer deposition conditions of: approximate temperature range from 150 to 550° C., pressure range from 10 to 200 mTorr, deposition rate ranging from 0.01 to 0.6 nm per cycle, and pulse time varying from 0.05 to 0.5 seconds.

8. The method of claim 1, wherein said first copper barrier layer overlying the insulating layers comprising precursors of compound A, $TiCl_4$, $TiI_4$, ($TiCl_3+Ti_2Cl_2$), or TEMAT, $Ti[N(C_2H_5)_2]_4$, tetrakis-(ethylmethylamido) titanium, plus compound B, $NH_3$, to yield compound S, TiN, deposited by atomic layer deposition.

9. The method of claim 1, wherein said first copper barrier layer overlying the insulating layers comprising precursors of compound A, TDMAT, $Ti[N(CH_3)_2]_4$, tetrakis-(dimethyl (amino) titanium, plus compound B, $SiH_4$, to yield compound S, TiSiN, deposited by atomic layer deposition.

10. The method of claim 1, wherein said first copper barrier layer overlying the insulating layers comprising precursors of compound A, $TaCl_5$, plus compound B, $NH_3$, to yield compound S, $TaN_x$, deposited by atomic layer deposition.

11. The method of claim 1, wherein said first copper barrier layer overlying the insulating layers comprising precursors of compound A, TBTDET, $N(Et_2)_3Ta=NBu^+$, tert-butylimido tris-(diethylamido) tantalum, plus compound B, $H^+$ radicals, to yield compound S, TaN, deposited by atomic layer deposition.

12. The method of claim 1, wherein said first copper barrier layer overlying the insulating layers comprising precursors of compound A, $MoCl_5$, plus compound B, $NH_3$, to yield compound S, $MO_2N$ and MoN, deposited by atomic layer deposition.

13. The method of claim 1, wherein said first copper barrier layer overlying the insulating layers comprising precursors of compound A, $NbCl_5$, plus compound B, $NH_3$, to yield compound S, NbN, deposited by atomic layer deposition.

14. The method of claim 1, wherein said first copper barrier layer overlying the insulating layers comprising precursors of compound A, $WF_6$, plus compound B, $NH_3$, to yield compound S, $WN_x$, deposited by atomic layer deposition.

15. The method of claim 1, wherein said copper seed layer overlying the first copper barrier layer, comprising copper deposited by atomic layer deposition, and further, thickness range from 20 to 200 Angstroms, with atomic layer deposition conditions of:

approximate temperature range from 200 to 300° C., pressure range from 10 to 200 mTorr, deposition rate ranging from 0.01 to 0.05 nm per cycle, and pulse time varying from 0.05 to 0.5 seconds.

16. The method of claim 1, wherein said electroless plated copper on the copper seed layer, filling trench and channel or tunnel openings with an excess of copper, comprising the following deposition conditions: a liquid plating bath mixture comprising $CuSO_4$, HF, HCl, $CH_2O$ with heat in a temperature range from 25 to 65° C., yielding a copper plating thickness ranging from 2,000 to 10,000 Angstroms.

17. The method of claim 1, wherein said excess copper is planarized back by chemical mechanical polishing, to form inlaid copper interconnect wiring and inductors.

18. The method of claim 1, wherein said second copper barrier layer overlying the copper, comprises a layer of SiN, deposited by PECVD, plasma-enhanced chemical vapor deposition, with thickness ranging from 200 to 1000 Angstroms.

19. A method to deposit a copper barrier and seed layer for electroless copper plating, filling trench and channel or tunnel openings in the fabrication of interconnects and inductors, comprising the following steps:

(a) providing a first insulating layer, overlying a semiconductor substrate with a passivating, etch stop layer thereon;

(b) providing a second insulating layer overlying said first insulating layer;

(c) forming trench and channel or tunnel openings in the first and second insulating layer;

(d) depositing a first copper barrier layer, comprised of TaN, overlying said insulating layers, by atomic layer deposition, and into the trench and channel or tunnel openings;

(e) depositing a copper seed layer overlying said first copper barrier layer, by atomic layer deposition using precursors of copper compound A, copper(II)-hexafluoroacetyacetonate or copper(thd)$_2$, tetramethyl heptanedione and water vapor, as a first step, then followed by compound B, reducing agents isopropanol or formalin;

(f) performing electroless copper plating copper on said copper seed layer filling trench and channel or tunnel openings with an excess of copper;

(g) removing said excess of copper and planarizing back the excess copper by chemical mechanical polishing;

(h) depositing a second copper barrier layer, comprised of SiN, overlying the copper, thus completing the fabrication of inlaid copper interconnects and inductors.

20. The method of claim 19, wherein said substrate includes a semiconductor substrate or module, wherein the substrate with semiconductor device structures comprising gate electrodes and source/drain regions.

21. The method of claim 19, wherein said substrate includes a semiconductor substrate or module, wherein the substrate with semiconductor device structures comprising gate electrodes, source/drain regions and multiple levels of metal interconnections.

22. The method of claim 19, wherein multilevel inlaid copper interconnects and inductors are fabricated by repeating steps (b) through (h).

23. The method of claim 19, wherein said first and second insulating layers are comprised of low dielectric constant material or materials comprising: SiN, SiO, SOG spin-on glass, PE plasma enhanced TEOS, tetraethoxysilane deposition, halogenated SiO, fluorinated silicate glass in a thickness range from 2,000 to 10,000 Angstroms, deposited by chemical vapor deposition or SOG, spin-on glass.

24. The method of claim 19, wherein said first copper barrier layer overlying the insulating layers, is selected from the group consisting of TiN, TiSiN, TaN, $TaN_x$, ($MO_2N$ and MoN), NbN, or $WN_x$, deposited by atomic layer deposition, to a thickness ranging from 20 to 200 Angstroms.

25. The method of claim 19, wherein said first copper barrier layer overlying the insulating layers comprising precursors of compound A plus compound B to yield compound S, deposited by atomic layer deposition, comprising a thickness range from 20 to 200 Angstroms, with atomic layer deposition conditions of:

approximate temperature range from 150 to 550° C., pressure range from 10 to 200 mTorr, deposition rate ranging from 0.01 to 0.6 nm per cycle, and pulse time varying from 0.05 to 0.5 seconds.

26. The method of claim 19, wherein said first copper barrier layer overlying the insulating layers comprising precursors of compound A, TiCl$_4$, TiI$_4$, (TiCl$_3$+Ti$_2$Cl$_2$), or TEMAT, Ti[N(C$_2$H$_5$)$_2$]$_4$, tetrakis-(ethylmethylamido) titanium, plus compound B, NH$_3$, to yield compound S, TiN, deposited by atomic layer deposition.

27. The method of claim 19, wherein said first copper barrier layer overlying the insulating layers comprising precursors of compound A, TDMAT, Ti[N(CH$_3$)$_2$]$_4$, tetrakis-(dimethyl(amino) titanium, plus compound B, SiH$_4$, to yield compound S, TiSiN, deposited by atomic layer deposition.

28. The method of claim 19, wherein said first copper barrier layer overlying the insulating layers comprising precursors of compound A, TaCl$_5$, plus compound B, NH$_3$, to yield compound S, TaN$_x$, deposited by atomic layer deposition.

29. The method of claim 19, wherein said first copper barrier layer overlying the insulating layers comprising precursors of compound A, TBTDET, N(Et$_2$)$_3$Ta=NBu$^+$, tert-butylimido tris-(diethylamido) tantalum, plus compound B, H$^+$ radicals, to yield compound S, TaN, deposited by atomic layer deposition.

30. The method of claim 19, wherein said first copper barrier layer overlying the insulating layers comprising precursors of compound A, MoCl$_5$, plus compound B, NH$_3$, to yield compound S, Mo$_2$N and MoN, deposited by atomic layer deposition.

31. The method of claim 19, wherein said first copper barrier layer overlying the insulating layers comprising precursors of compound A, NbCl$_5$, plus compound B, NH$_3$, to yield compound S, NbN, deposited by atomic layer deposition.

32. The method of claim 19, wherein said first copper barrier layer overlying the insulating layers comprising precursors of compound A, WF$_6$, plus compound B, NH$_3$, to yield compound S, WN$_x$, deposited by atomic layer deposition.

33. The method of claim 19, wherein said copper seed layer overlying the first copper barrier layer, comprising copper deposited by atomic layer deposition, and further, thickness range from 20 to 200 Angstroms, with atomic layer deposition conditions of:

approximate temperature range from 200 to 300° C., pressure range from 10 to 200 mTorr, deposition rate ranging from 0.01 to 0.05 nm per cycle, and pulse time varying from 0.05 to 0.5 seconds.

34. The method of claim 19, wherein said electroless plated copper on the copper seed layer, filling trench and channel or tunnel openings with an excess of copper, comprising the following deposition conditions: a liquid plating bath mixture comprising CuSO$_4$, HF, HCl, CH$_2$O with heat in a temperature range from 25 to 65° C., yielding a copper plating thickness ranging from 2,000 to 10,000 Angstroms.

35. The method of claim 19, wherein said excess copper is planarized back by chemical mechanical polishing, to form inlaid copper interconnect wiring and inductors.

36. The method of claim 19, wherein said second copper barrier layer overlying the copper, comprises a layer of SiN, deposited by PECVD, plasma-enhanced chemical vapor deposition, with thickness ranging from 200 to 1000 Angstroms.

37. A method to deposit a copper barrier and seed layer for electroless copper plating, filling trench and channel or tunnel openings in the fabrication of interconnects and inductors, comprising the following steps:

(a) providing a first insulating layer, overlying a semiconductor substrate with a passivating, etch stop layer thereon;

(b) providing a second insulating layer overlying said first insulating layer;

(c) forming trench and channel or tunnel openings in the first and second insulating layer;

(d) depositing a first copper barrier layer, comprised of TaN, TaN$_x$, TiN, TiSiN, MoN$_x$, NbN, or WN$_x$, overlying said insulating layers, by atomic layer deposition with a thickness of 50 to 2,000 Angstroms, and into the trench and channel or tunnel openings;

(e) depositing a copper seed layer, comprised of copper, overlying said first copper barrier layer, by atomic layer deposition with a thickness of 20 to 200 Angstroms using precursors of copper compound A, copper(II)-hexafluoroacetyacetonate or copper(thd)$_2$, tetramethyl heptanedione and water vapor, as a first step, then followed by compound B, reducing agents isopropanol or formalin;

(f) performing electroless copper plating copper, with a thickness of 2,000 to 10,000 Angstroms, on said copper seed layer filling trench and channel or tunnel openings with an excess of copper;

(g) removing said excess of copper and planarizing back the excess copper by chemical mechanical polishing;

(h) depositing a second copper barrier layer, comprised of SiN, overlying the copper, and with a thickness of 200 to 1,000 Angstroms, thus completing the fabrication of inlaid copper interconnects and inductors.

38. The method of claim 37, wherein said substrate includes a semiconductor substrate or module, wherein the substrate with semiconductor device structures comprising gate electrodes and source/drain regions.

39. The method of claim 37, wherein said substrate includes a semiconductor substrate or module, wherein the substrate with semiconductor device structures comprising gate electrodes, source/drain regions and multiple levels of metal interconnections.

40. The method of claim 37, wherein multilevel inlaid copper interconnects and inductors are fabricated by repeating steps (b) through (h).

41. The method of claim 37, wherein said first and second insulating layers are comprised of low dielectric constant material or materials comprising: SiN, SiO, SOG spin-on glass, PE plasma enhanced TEOS, tetraethoxysilane deposition, halogenated SiO, fluorinated silicate glass in a thickness range from 2,000 to 10,000 Angstroms, deposited by chemical vapor deposition or SOG, spin-on glass.

42. The method of claim 37, wherein said first copper barrier layer overlying the insulating layers, is selected from the group consisting of TiN, TiSiN, TaN, TaN$_x$, (MO$_2$N and MoN), NbN, or WN$_x$, deposited by atomic layer deposition, to a thickness ranging from 20 to 200 Angstroms.

43. The method of claim 37, wherein said first copper barrier layer overlying the insulating layers comprising precursors of compound A plus compound B to yield compound S, deposited by atomic layer deposition, comprising a thickness range from 20 to 200 Angstroms, with atomic layer deposition conditions of:

approximate temperature range from 150 to 550° C., pressure range from 10 to 200 mTorr, deposition rate ranging from 0.01 to 0.6 nm per cycle, and pulse time varying from 0.05 to 0.5 seconds.

44. The method of claim 37, wherein said first copper barrier layer overlying the insulating layers comprising precursors of compound A, TiCl$_4$, TiI$_4$, (TiCl$_3$+Ti$_2$Cl$_2$), or TEMAT, Ti[N(C$_2$H$_5$)$_2$]$_4$, tetrakis-(ethylmethylamido)

titanium, plus compound B, $NH_3$, to yield compound S, TiN, deposited by atomic layer deposition.

45. The method of claim 37, wherein said first copper barrier layer overlying the insulating layers comprising precursors of compound A, TDMAT, $Ti[N(CH_3)_2]_4$, tetrakis-(dimethyl(amino) titanium, plus compound B, $SiH_4$, to yield compound S, TiSiN, deposited by atomic layer deposition.

46. The method of claim 37, wherein said first copper barrier layer overlying the insulating layers comprising precursors of compound A, $TaCl_5$, plus compound B, $NH_3$, to yield compound S, $TaN_x$, deposited by atomic layer deposition.

47. The method of claim 37, wherein said first copper barrier layer overlying the insulating layers comprising precursors of compound A, TBTDET, $N(Et_2)_3Ta{=}NBu^+$, tert-butylimido tris-(diethylamido) tantalum, plus compound B, $H^+$ radicals, to yield compound S, TaN, deposited by atomic layer deposition.

48. The method of claim 37, wherein said first copper barrier layer overlying the insulating layers comprising precursors of compound A, $MoCl_5$, plus compound B, $NH_3$, to yield compound S, $Mo_2N$ and MoN, deposited by atomic layer deposition.

49. The method of claim 37, wherein said first copper barrier layer overlying the insulating layers comprising precursors of compound A, $NbCl_5$, plus compound B, $NH_3$, to yield compound S, NbN, deposited by atomic layer deposition.

50. The method of claim 37, wherein said first copper barrier layer overlying the insulating layers comprising precursors of compound A, $WF_6$, plus compound B, $NH_3$, to yield compound S, $WN_x$, deposited by atomic layer deposition.

51. The method of claim 37, wherein said copper seed layer overlying the first copper barrier layer, comprising copper deposited by atomic layer deposition, and further, thickness range from 20 to 200 Angstroms, with atomic layer deposition conditions of:

approximate temperature range from 200 to 300° C., pressure range from 10 to 200 mTorr, deposition rate ranging from 0.01 to 0.05 nm per cycle, and pulse time varying from 0.05 to 0.5 seconds.

52. The method of claim 37, wherein said electroless plated copper on the copper seed layer, filling trench and channel or tunnel openings with an excess of copper, comprising the following deposition conditions: a liquid plating bath mixture comprising $CuSO_4$, HF, HCl, $CH_2O$ with heat in a temperature range from 25 to 65° C., yielding a copper plating thickness ranging from 2,000 to 10,000 Angstroms.

53. The method of claim 37, wherein said excess copper is planarized back by chemical mechanical polishing, to form inlaid copper interconnect wiring and inductors.

54. The method of claim 37, wherein said second copper barrier layer overlying the copper, comprises a layer of SiN, deposited by PECVD, plasma-enhanced chemical vapor deposition, with thickness ranging from 200 to 1000 Angstroms.

* * * * *